United States Patent
Lee et al.

(10) Patent No.: US 6,339,006 B1
(45) Date of Patent: Jan. 15, 2002

(54) FLASH EEPROM CELL AND METHOD OF MANUFACTURING THE SAME

(75) Inventors: Min Kyu Lee; Hee Hyun Chang; Hee Youl Lee; Dong Kee Lee, all of Kyungki-Do (KR)

(73) Assignee: Hyundai Electronics Ind. Co., Ltd., Kyungki-Do (KR)

( * ) Notice: Subject to any disclaimer, the term of this patent is extended or adjusted under 35 U.S.C. 154(b) by 0 days.

(21) Appl. No.: 09/609,337

(22) Filed: Jun. 30, 2000

(30) Foreign Application Priority Data

Jun. 30, 1999 (KR) .............................. 99-25769

(51) Int. Cl.[7] ............................................ H01L 21/331
(52) U.S. Cl. ..................................... 438/366; 438/266
(58) Field of Search ............................... 438/366, 266, 438/267; 257/320, 315, 316, 319

(56) References Cited

U.S. PATENT DOCUMENTS

| | | | |
|---|---|---|---|
| 5,712,815 A | 1/1998 | Bill et al. | 365/185.03 |
| 5,717,632 A | 2/1998 | Richart et al. | 365/185.2 |
| 5,768,188 A | 6/1998 | Park et al. | 365/185.03 |
| 5,815,439 A | 9/1998 | Korsh et al. | 365/185.24 |
| 5,877,523 A * | 3/1999 | Liang et al. | 257/315 |
| 5,901,089 A | 5/1999 | Korsh et al. | 365/185.24 |
| 5,929,480 A | 7/1999 | Hisamune | 257/320 |
| 5,930,172 A | 7/1999 | Kucera | 365/185.21 |
| 5,936,971 A | 8/1999 | Harari et al. | 371/10.2 |
| 5,959,896 A | 9/1999 | Forbes | 365/185.33 |
| 5,986,929 A | 11/1999 | Sugiura et al. | 365/185.03 |
| 5,999,446 A | 12/1999 | Harari et al. | 365/185.03 |
| 6,034,893 A * | 3/2000 | Mehta | 365/185.14 |
| 6,168,995 B1 * | 1/2001 | Kelley et al. | 438/266 |
| 6,188,102 B1 * | 2/2001 | Tsukiji | 257/315 |

FOREIGN PATENT DOCUMENTS

| | | |
|---|---|---|
| JP | 5-74179 | 3/1993 |
| JP | 9-90971 | 4/1997 |
| JP | 9-181204 | 7/1997 |
| JP | 10-55688 | 2/1998 |
| JP | 10-125083 | 5/1998 |
| JP | 10-308462 | 11/1998 |
| JP | 11-73786 | 3/1999 |
| JP | 11-73787 | 3/1999 |
| JP | 11-149789 | 6/1999 |
| JP | 11-162181 | 6/1999 |
| JP | 11-260077 | 9/1999 |

* cited by examiner

*Primary Examiner*—Caridad Everhart
(74) *Attorney, Agent, or Firm*—Pennie & Edmonds LLP

(57) ABSTRACT

The invention relates to a flash EEPROM cell and method of manufacturing the same. The method of manufacturing a flash EEPROM cell includes sequentially forming a tunnel oxide film, a polysilicon layer for a floating gate and a hard mask layer on a semiconductor substrate; patterning the hard mask layer and then forming a hard mask layer spacer at the etching side of the patterned hard mask layer; removing the exposed portion of the polysilicon layer for the floating gate by etching process using the patterned hard mask layer and the hard mask layer spacer as etching masks thus to form first and second patterns that are separated in two; removing the patterned hard mask layer and the hard mask layer spacer and then depositing a dielectric film and a polysilicon layer for a control gate on the entire structure, thus forming a first floating gate, a second floating gate and a control gate by self-aligned etching process; and forming a drain junction and a source junction by cell source/drain ion implantation process. Thus, the present invention can prevent lower of the quality of the tunnel oxide film and thus increase the coupling ratio.

14 Claims, 1 Drawing Sheet

FLASH EEPROM CELL AND METHOD OF MANUFACTURING THE SAME

BACKGROUND OF THE INVENTION

1. Field of the Invention

The invention relates generally to a flash EEPROM cell and method of manufacturing the same. More particularly, the present invention relates to a flash EEPROM cell in which two floating gates having different sizes can be simply formed at a single cell using a hard mask layer in a multi-level cell, capable of preventing lower of the quality of a tunnel oxide film and increasing the coupling ratio, and method of manufacturing the same.

2. Description of the Prior Art

The greatest bottleneck to prevent customization of the current flash EEPROM is that the cost per unit information is high. For this, the higher integration of a cell is required and thus various manufacturers have made an effort to develop it. However, as the structure of the EEPROM is complicated compared to that of the DRAM, there is a problem that the integration level of the EEPROM is difficult to increase.

The conventional flash EEPROM cell has only two states (storing only binary information) depending on whether the electrons is charged at the floating gate or not. Thus, it has a drawback that the chip size is increased due to one bit per one cell in the large-scale configuration of the cell array depending on it.

On the other hand, as the multi-level cell has four states, it can store information at one cell instead of storing it at two cells. Thus, it can store much information at the same area. However, in the multi-level cell, as two floating gates have to be formed at one cell, many processes has to be experienced to manufacture it. Also, as forming the tunnel oxide film has to be performed in two steps, it is difficult to assure the quality of the tunnel oxide film and to assure the quality of the tunnel oxide film below a poly spacer in case of using the poly spacer.

SUMMARY OF THE INVENTION

It is therefore an object of the present invention to provide a flash EEPROM cell in which two floating gates having different size can be simply formed at a single cell using a hard mask layer in a multi-level cell, capable of preventing lower of the quality of a tunnel oxide film and increasing the coupling ratio, and method of manufacturing the same.

In order to accomplish the above object, a flash EEPROM cell according to the present invention is characterized in that it comprises first and second floating gates, that are different in size and separated in two, formed to be electrically separated from a semiconductor substrate by a tunnel oxide film; control gate formed to be electrically separated from said first and second floating gates by a dielectric film; drain junction formed on said semiconductor substrate at the side of said first floating gate; and source junction formed on said semiconductor substrate at the side of said second floating gate.

Also, in order to accomplish the above object, the method of manufacturing a flash EEPROM cell according to the present invention is characterized in that it comprises the steps of sequentially forming a tunnel oxide film, a polysilicon layer for a floating gate and a hard mask layer on a semiconductor substarate; patterning said hard mask layer and then forming a hard mask layer spacer at the etching side of the patterned hard mask layer; removing the exposed portion of the polysilicon layer for the floating gate by etching process using said patterned hard mask layer and said hard mask layer spacer as etching mask thus to form first and second paterns that are separated in two; removing said patterned hard mask layer and said hard mask layer spacer and then depositing a dielectric film and a polysilicon layer for a control gate on the entire structure, thus forming a first floating gate, a second floating gate and a control gate by self-aligned etching process; and forming a drain junction and a source junction by cell source/drain ion implantation process.

BRIEF DESCRIPTION OF THE DRAWINGS

The aforementioned aspects and other features of the present invention will be explained in the following description, taken in conjunction with the accompanying drawings, wherein.

DETAILED DESCRIPTION OF PREFERRED EMBODIMENTS

Figure 1A:
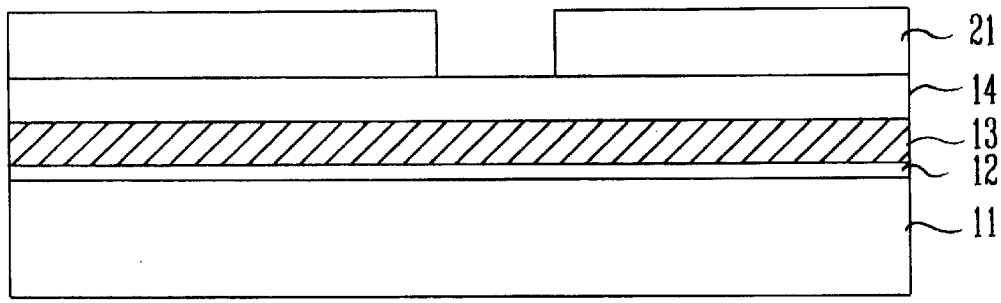
FIGS. 1A through 1D are sectional views for explaining a flash EEPROM cell and method of manufacturing the same according to the present invention.

The present invention will be described in detail by way of a preferred embodiment with reference to accompanying drawings, in which like reference numerals are used to identify the same or similar parts.

FIGS. 1A through 1D are sectional views for explaining a flash EEPROM cell and method of manufacturing the same according to the present invention.

Referring now to FIG. 1A, a field oxide film (not shown) is formed and a tunnel oxide film 12 is formed on a semiconductor substrate 11 in which an active region and a field region are defined. Then, a polysilicon layer for the floating gate 13 is formed on the tunnel oxide film 12. Next, a hard mask layer 14 is formed on the polysilicon layer for the floating gate 13. Thereafter, a photoresist pattern 21 is formed on the hard mask 14 by exposure and developing process using the mask for the floating gate.

In the above, the tunnel oxide film 12 is formed in thickness of 50 through 150 Angstrom and the polysilicon layer 13 for the floating gate is formed in thickness of 300 through 2000 Angstrom. The hard mask layer 14 is formed of nitride, oxy-nitride, oxide etc. having a high etch selectivity upon etching of the polysilicon layer, in thickness of 200 through 2000 Angstrom. The photoresist pattern 21 is formed at a minimum feature size that can be formed by exposure process in order to reduce its chip size.

Figure 1B:
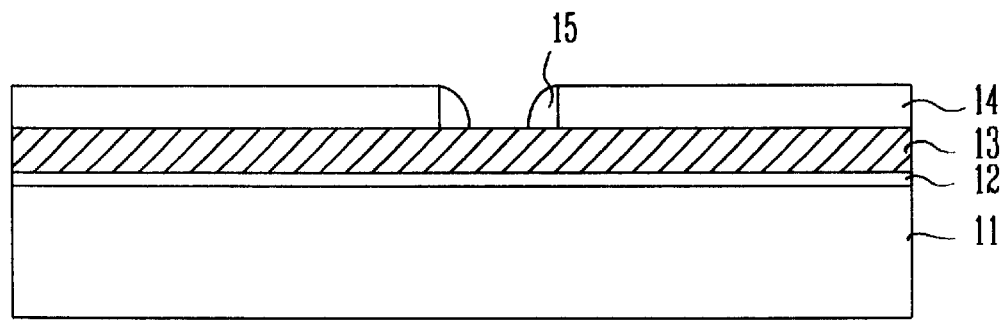

Referring to FIG. 1B, the mask layer 14 is patterned by etching process using the photoresist pattern 21 as an etching mask. After the photoresist pattern 21 is removed, a hard mask layer spacer 15 is formed at the etching face of the patterned hard mask layer 14.

In the above, the hard mask layer spacer 15 is formed of nitride, oxy-nitride, oxide etc. having a high etch selectivity upon etching of the polysilicon layer, in thickness of 200 through 2000 Angstrom, using blanket etching process. As the hard mask layer spacer 15 is formed, still smaller size of spacer can be obtained than the minimum size that can be formed by exposure process, thus increasing the effect of reducing the chip size.

Figure 1C:
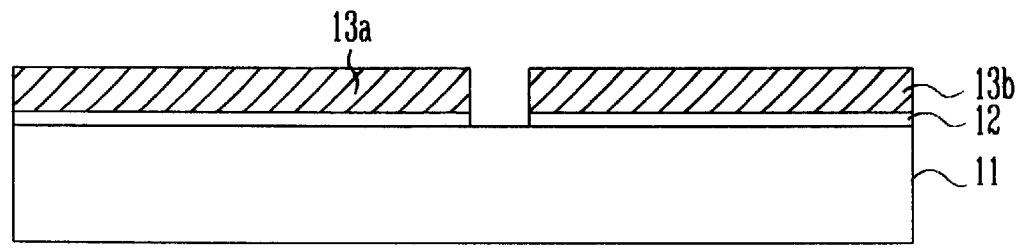

Referring now to FIG. 1C, by etching process using the patterned hard mask layer 14 and the hard mask layer spacer 15 as etching mask, the exposed portion of the polysilicon layer for the floating gate 13 is removed to form a first pattern 13a and a second pattern 13b which are separated in two section. Then, annealing process for recovering the portion of the tunnel oxide film 12 that is damaged by etching process is performed.

Figure 1D:
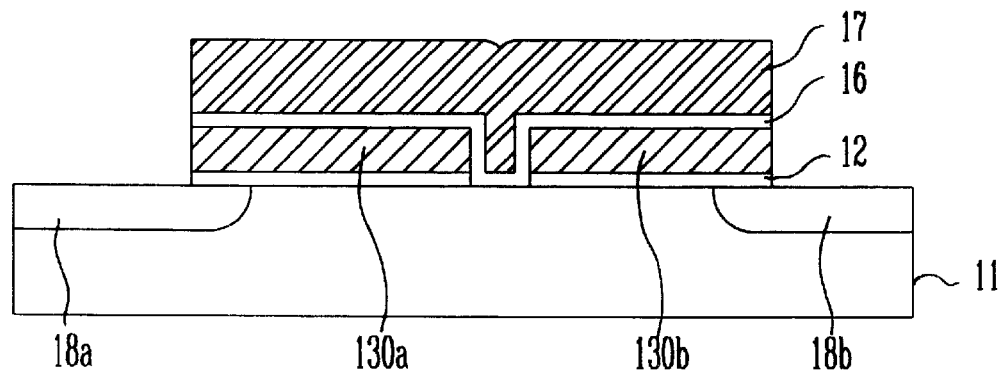

Referring to FIG. 1D, the patterned hard mask layer 14 and the hard mask layer spacer 15 are removed and a dielectric film 16 and a polysilicon layer for the control gate 17 are deposited on the entire structure including the first pattern 13a and the second pattern 13b which are separated into two sections. Then, self-aligned etching process using the control gate as a mask is used to allow the polysilicon layer for the control gate 17 and the polysilicon layer for the floating gate 13 etching the first pattern 13a and the second pattern 13b which are separated in two sections, thus forming a first floating gate 130a made of some of the first pattern 13a, a second floating gate 130b made of some of the second pattern 13b and a control gate 17 lying over the floating gates 130a and 130b. Then, a drain junction 18a and a source junction 18b are formed by cell source/drain ion implantation process.

In the above, the dielectric film 16 is consisted of the combination of oxide and nitride and has the thickness of 100 through 300 Angstrom. The polysilicon layer for the control gate 17 is formed in thickness of 300 through 2000 Angstrom. A polycide layer may be formed instead of the polysilicon layer for the control gate 17. The first floating gate 130a and the second floating gate 130b are different in size wherein the ratio of the size of the size of the first floating gate 130a to the second floating gate 130b is 1/3 through 1. The drain junction 18a is formed on the semiconductor substrate 11 at the side of the first floating gate 130a and the source junction 18b is formed on the semiconductor substrate 11 at the side of the second floating gate 130b.

Meanwhile, additional process may be added, by which the patterned hard mask layer 14 and the hard mask layer spacer 15 are removed and then dopants different in polarity with the semiconductor substrate 11 are ion-implanted at the dose of 1E14 through 7E16 ions/cm².

In the flash EEPROM cell of the present invention formed by the above process, the separate first and second floating gates 130a and 130b having different sizes are formed to be electrically separated from the semiconductor substrate 11 by the tunnel oxide film. The control gate 17 is formed to be electrically separated from the first and second floating gates 130a and 130b by the dielectric film 16, the drain junction 18a is located at the side of the first floating gate 130a and the source junction 18b is formed at the side of the second floating gate 130b.

In the flash EEPROM cell manufactured by an embodiment of the present invention, the erase operation is performed to discharge from the floating gates to the junction or the channel region due to a tunneling method, and the program operation does not have a significant hot carrier injection problem.

As described above, the flash EEPROM cell using the multi-level cell of the present invention can increase the productivity of the wafers due to the effect of chip size reduction because it allows a data memory of two bits on one cell, can assure the quality of the tunnel oxide film since it can simply form the floating gate most important in the multi-level cell, and can increase the throughput due to increased speed and uniformity upon program and erase because the coupling ratio between the control gate and the floating gate is increased as much as the hard mask layer spacer.

The present invention has been described with reference to a particular embodiment in connection with a particular application. Those having ordinary skill in the art and access to the teachings of the present invention will recognize additional modifications and applications within the scope thereof It is therefore intended by the appended claims to cover any and all such applications, modifications, and embodiments within the scope of the present invention.

What is claimed is:

1. A method of manufacturing a flash EEPROM cell, comprising the steps of:
   sequentially forming a tunnel oxide film, a polysilicon layer for a floating gate and a hard mask layer on a semiconductor substrate;
   patterning said hard mask layer and then forming a hard mask layer spacer at the etching side of the patterned hard mask layer;
   removing the exposed portion of the polysilicon layer for the floating gate by etching process using said patterned hard mask layer and said hard mask layer spacer as etching masks thus to form first and second patterns that are separated in two;
   removing said patterned hard mask layer and said hard mask layer spacer and then depositing a dielectric film and a polysilicon layer for a floating gate on the entire structure, thus forming a first floating gate, a second floating gate and a control gate by self-aligned etching process, wherein the first floating gate and the second floating gate are different in size; and
   forming a drain junction and a source junction by cell source/drain ion implantation process.

2. The method of manufacturing a flash EEPROM cell according to claim 1, wherein said tunnel oxide film is formed in thickness of 50 through 150 Angstrom and said polysilicon layer for the floating gate is formed in thickness of 300 through 2000 Angstrom.

3. The method of manufacturing a flash EEPROM cell according to claim 1, wherein said hard mask layer is formed in thickness of 200 through 2000 Angstrom using one of nitride, oxy-nitride and oxide which have high etching selectivity upon poly etching.

4. The method of manufacturing a flash EEPROM cell according to claim 1, wherein said spacer for the hard mask layer is formed in thickness of 200 through 2000 Angstrom using one of nitride, oxy-nitride and oxide which have high etching selectivity upon poly etching and is then performed by blanket etching process.

5. The method of manufacturing a flash EEPROM cell according to claim 1, wherein after the first and second patterns are formed, an annealing process is performed in order to recover the tunnel oxide portion that is damaged by the etching process.

6. The method of manufacturing a flash EEPROM cell according to claim 1, wherein said dielectric film is made of a combination of oxide and nitride and has the thickness of 100 through 300 Angstrom.

7. The method of manufacturing a flash EEPROM cell according to claim 1, wherein said polysilicon layer for the control gate is formed in thickness of 300 through 2000 Angstrom.

8. The method of manufacturing a flash EEPROM cell according to claim 1, wherein the ratio of the size of said first floating gate to said second floating gate is 1/3 to less than 1.

9. The method of manufacturing a flash EEPROM cell according to claim 1, wherein said drain junction is formed at the semiconductor substrate of said first floating gate side, and said source junction is formed at the semiconductor substrate of said second floating gate side.

10. The method of manufacturing a flash EEPROM cell according to claim 1, wherein after said patterned hard mask layer and said hard mask layer spacer are removed, dopants having a polarity different with said semiconductor substrate are ion-implanted with the dose of 1E14 through 7E16 ions/cm$^2$.

11. A method of manufacturing a flash EEPROM cell, comprising the steps of:

sequentially forming a tunnel oxide film, a first polysilicon layer and a hard mask layer on a semiconductor substrate;

patterning said hard mask layer to thereby expose a first portion of said first polysilicon layer;

etching the first portion of the first polysilicon layer through the patterned hard mask layer to thereby form spaced apart first and second polysilicon patterns;

removing the patterned hard mask layer;

forming a dielectric film over the first and second polysilicon patterns;

forming a second polysilicon layer over the dielectric film;

patterning the second polysilicon layer to form a single control gate and patterning the first and second polysilicon patterns to form first and second floating gates, such that the single control gate overlies both the first and second floating gates; and implanting ions to form a drain junction and a source junction, wherein the first floating gate and the second floating gate are different in size.

12. The method according to claim 11, wherein the step of implanting ions is performed after the step of patterning the second polysilicon layer.

13. The method according to claim 11, wherein:

the tunnel oxide underlying the first portion of the first polysilicon layer is also etched, thereby exposing a first portion of the substrate, and the dielectric film is formed over the first portion of the substrate at the same time that the dielectric film is formed over the first and second polysilicon patterns.

14. The method according to claim 11, further comprising the step of forming hard mask spacers on etched sides of the hard mask layers, prior to the step of etching the first portion of the first polysilicon layer through the patterned hard mask layer.

* * * * *